(12) United States Patent
Kishigami

(10) Patent No.: US 9,819,371 B2
(45) Date of Patent: Nov. 14, 2017

(54) ELECTRONIC DEVICE

(71) Applicant: DENSO CORPORATION, Kariya, Aichi-pref. (JP)

(72) Inventor: Tomohisa Kishigami, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/160,133

(22) Filed: May 20, 2016

(65) Prior Publication Data

US 2016/0365881 A1 Dec. 15, 2016

(30) Foreign Application Priority Data

Jun. 12, 2015 (JP) .................................. 2015-119337

(51) Int. Cl.
| | | |
|---|---|---|
| H04B 1/66 | (2006.01) | |
| H03D 1/04 | (2006.01) | |
| H04L 25/08 | (2006.01) | |
| H04B 1/04 | (2006.01) | |
| H03H 11/24 | (2006.01) | |
| H03K 5/24 | (2006.01) | |
| H04B 1/40 | (2015.01) | |

(52) U.S. Cl.
CPC ......... *H04B 1/0475* (2013.01); *H03H 11/245* (2013.01); *H03K 5/24* (2013.01); *H04B 1/40* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,438,364 | B1 * | 8/2002 | Waite ........................ | H03F 1/22 455/323 |
| 8,098,084 | B2 * | 1/2012 | Suzuki ................ | H04L 25/0278 326/115 |
| 8,587,339 | B2 * | 11/2013 | Johnson ................ | H04L 25/026 326/82 |
| 9,306,514 | B2 * | 4/2016 | Kwon ...................... | H03F 1/565 |
| 9,459,369 | B2 * | 10/2016 | Roach ........................ | G01P 3/49 |
| 2004/0229582 | A1 * | 11/2004 | Miyasita ............. | H03F 3/45197 455/136 |
| 2006/0152400 | A1 * | 7/2006 | Yada .................... | H03M 1/1023 341/155 |
| 2006/0267631 | A1 * | 11/2006 | Tabuchi ............. | G05B 19/0428 326/62 |

(Continued)

FOREIGN PATENT DOCUMENTS

JP 2000-216833 A 8/2000

*Primary Examiner* — Linda Wong
(74) *Attorney, Agent, or Firm* — Posz Law Group, PLC

(57) ABSTRACT

An electronic device includes a transceiver connected to a differential signal transmission line for transmitting a differential signal through a pair of signal lines to communicate with one or a plurality of other devices connected to the differential signal transmission line. The electronic device includes: a suppression circuit that is operated by a power source voltage to suppress waveform distortion in the differential signal transmitted through the differential signal transmission line; and a power source controller that controls supply or cutoff of the power source voltage to the suppression circuit in response to a change in a differential voltage between the pair of signal lines.

9 Claims, 5 Drawing Sheets

(56) References Cited

U.S. PATENT DOCUMENTS

| | | | | |
|---|---|---|---|---|
| 2007/0103248 A1* | 5/2007 | Nakamura | H03D 3/007 | 331/167 |
| 2007/0146089 A1* | 6/2007 | Komurasaki | H03B 5/1847 | 331/167 |
| 2009/0175378 A1* | 7/2009 | Staszewski | H01P 3/026 | 375/295 |
| 2010/0120383 A1* | 5/2010 | Kikuchi | H03F 3/45273 | 455/114.2 |
| 2011/0012639 A1* | 1/2011 | Tamura | H03F 3/45183 | 326/22 |
| 2011/0074525 A1* | 3/2011 | Kameya | H03H 7/0115 | 333/181 |
| 2011/0084730 A1* | 4/2011 | Suzuki | H04L 25/0278 | 326/82 |
| 2011/0101256 A1* | 5/2011 | Shimizu | H01L 31/02019 | 250/551 |
| 2011/0169547 A1 | 7/2011 | Suzuki et al. | | |
| 2011/0216244 A1* | 9/2011 | Shen | H04N 5/14 | 348/720 |
| 2011/0236027 A1* | 9/2011 | Nosaka | H03F 3/45085 | 398/135 |
| 2011/0241799 A1* | 10/2011 | Wang | H03H 7/427 | 333/181 |
| 2012/0075036 A1* | 3/2012 | Kameya | H03H 7/427 | 333/140 |
| 2012/0280732 A1* | 11/2012 | Roytman | H03K 5/086 | 327/175 |
| 2012/0293230 A1* | 11/2012 | Mori | H04L 25/026 | 327/313 |
| 2012/0295556 A1* | 11/2012 | Chien | H03F 1/56 | 455/78 |
| 2013/0099849 A1 | 4/2013 | Suzuki et al. | | |
| 2013/0222014 A1* | 8/2013 | Badillo | H03F 1/301 | 327/103 |
| 2013/0257488 A1* | 10/2013 | Sayuk | H04L 25/0274 | 327/108 |
| 2013/0259175 A1* | 10/2013 | Schley-May | H04B 3/02 | 375/346 |
| 2013/0344834 A1* | 12/2013 | Souto Diez | H03D 7/1441 | 455/245.1 |
| 2014/0073269 A1* | 3/2014 | Lin et al. | H04B 1/48 | 455/83 |
| 2015/0147991 A1* | 5/2015 | Koroglu | H03H 7/0169 | 455/180.1 |
| 2015/0171657 A1* | 6/2015 | Wheeland | H02J 7/025 | 307/104 |
| 2015/0180424 A1* | 6/2015 | Zanchi | H03F 3/005 | 330/260 |
| 2015/0349731 A1* | 12/2015 | Kwon | H03F 1/565 | 330/252 |
| 2017/0170721 A9* | 6/2017 | Kim | H02M 3/07 | |

* cited by examiner

ELECTRONIC DEVICE

CROSS REFERENCE TO RELATED APPLICATIONS

This application is based on Japanese Patent Application No. 2015-119337 filed on Jun. 12, 2015, the disclosure of which is incorporated herein by reference.

TECHNICAL FIELD

The present disclosure relates to an electronic device that is connected to a differential signal transmission line for transmitting a differential signal through a pair of signal lines so as to communicate with other devices.

BACKGROUND

As described in Patent Literature 1, it has been known that a waveform distortion suppression circuit operates with the supply of a power source voltage so as to suppress the distortion of the waveform of a differential signal transmitted through a differential signal transmission line.

It has been considered that the waveform distortion suppression circuit is arranged for one or more electronic devices in a communication system in which a plurality of electronic devices communicate through the differential signal transmission line. In this situation, with regard to the electronic device having the waveform distortion suppression circuit, it is configured to also supply the power source voltage to the waveform distortion suppression circuit when the power source for operation is supplied to the electronic device.

However, in a case of having a communication system in which a plurality of electronic devices with different periods of supplying operation power source, when an operation power source supplied to one part of the plurality of electronic device is cut off, the remaining part of the plurality of electronic devices may still perform communication. In this situation, since the waveform distortion suppression circuit in the electronic device previously cut off by the operation power source does not operate anymore, there is no suppression effect of waveform distortion exhibited by the waveform distortion suppression circuit. On the other hands, when the electronic device is configured to constantly supply a power source voltage to the waveform distortion suppression circuit, an increase in power consumption may occur.

[Patent Literature 1] JP-2012-244220-A

SUMMARY

It is an object of the present disclosure to provide an electronic device that enables the operation of a circuit for suppressing the distortion of the waveform of a differential signal when needed even when a power source voltage is not constantly supplied to the circuit.

An electronic device according to an aspect of the present disclosure has a transceiver connected to a differential signal transmission line for transmitting a differential signal through a pair of signal lines to communicate with one or a plurality of other devices connected to the differential signal transmission line. The electronic device includes: a suppression circuit that is operated by a power source voltage to suppress waveform distortion in the differential signal transmitted through the differential signal transmission line; and a power source controller that controls supply or cutoff of the power source voltage to the suppression circuit in response to a change in a differential voltage between the pair of signal lines.

According to this electronic device, when there is a change in the differential voltage after any of the devices including this electronic device connected to the differential signal transmission line executes transmission, the supply of the power source to the suppression circuit is carried out; and when there is no change in the differential voltage as the transmission is not carried out anymore, the cutoff of the power source voltage to the suppression circuit is carried out. Accordingly, even when the power source voltage is not constantly supplied to the suppression circuit, the suppression circuit may be operated if needed. Accordingly, the reduction in power consumption and the suppression of waveform distortion can be both achieved.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

The following describes an electronic control unit (hereinafter referred to as an "ECU") as an electronic device according to the following embodiments according to the present disclosure.

First Embodiment

Figure 1:
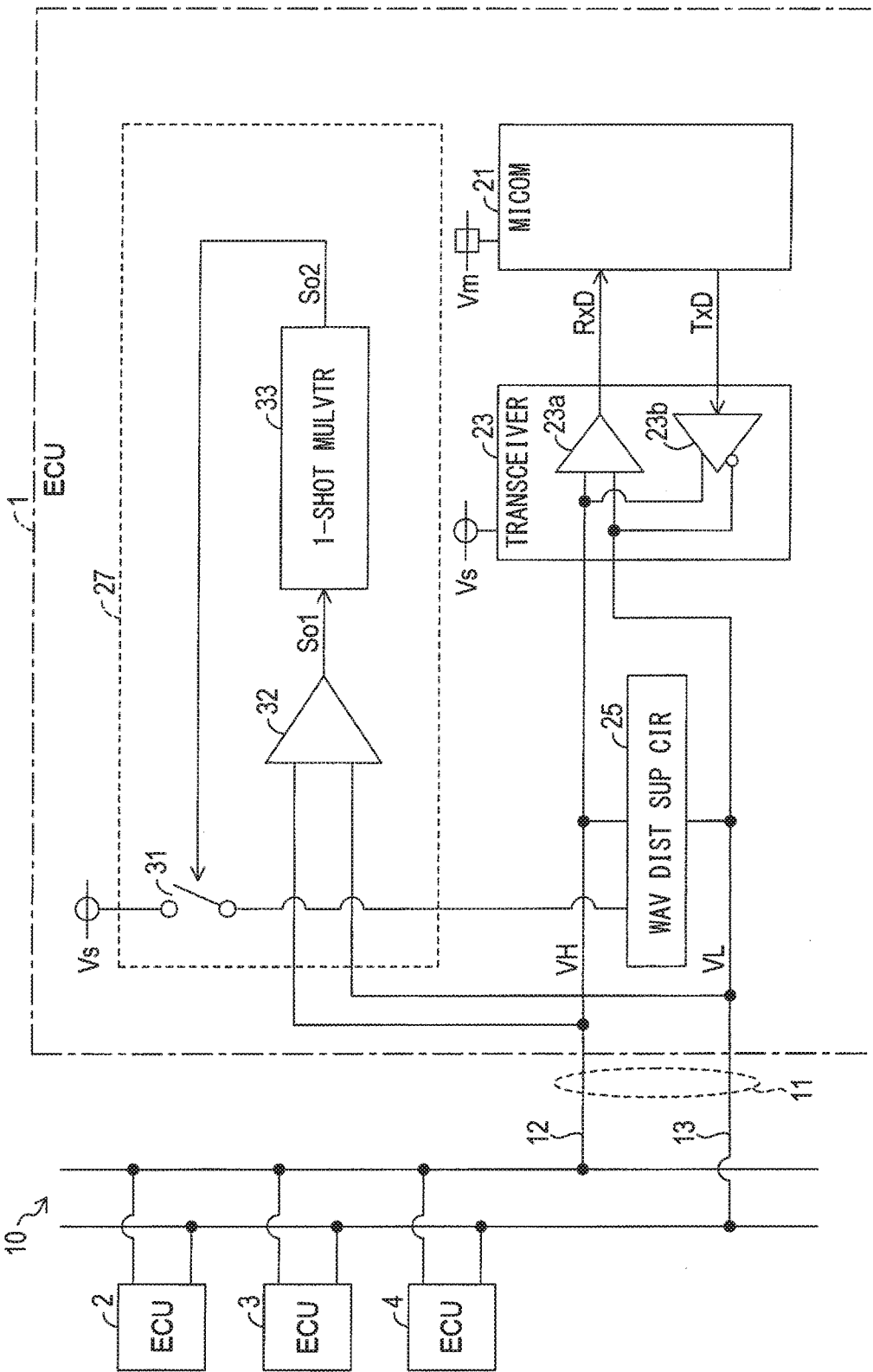
FIG. 1 is a drawing that shows the configuration of an ECU according to a first embodiment.

As shown in FIG. 1, an ECU 1 in the first embodiment is connected to a differential signal transmission line 11 as a communication bus. The differential signal transmission line 11 (hereinafter referred to as a "bus line 11") includes a pair of signal lines 12, 13, and includes a transmission line for transmitting a differential signal through the pair of signal lines 12, 13. In the present embodiment, the signal line 12 is a high potential signal line, and the signal line 13 is a low potential signal line. In addition, the bus line 11 is also connected to other plurality of ECUs. The present embodiment describes that three ECUs 2 to 4 are used as other ECUs; however, the number of other ECUs is not limited to three.

A communication system 10 configured by ECUs 1 to 4 and the bus line 11 includes, for example, a vehicular communication system mounted to an automobile. The communication mode (i.e., communication protocol) in the communication system 10 is performed by, for example, CAN (Controller Area Network: a registered trademark), however, the communication mode may be performed by other protocols.

Figure 3:
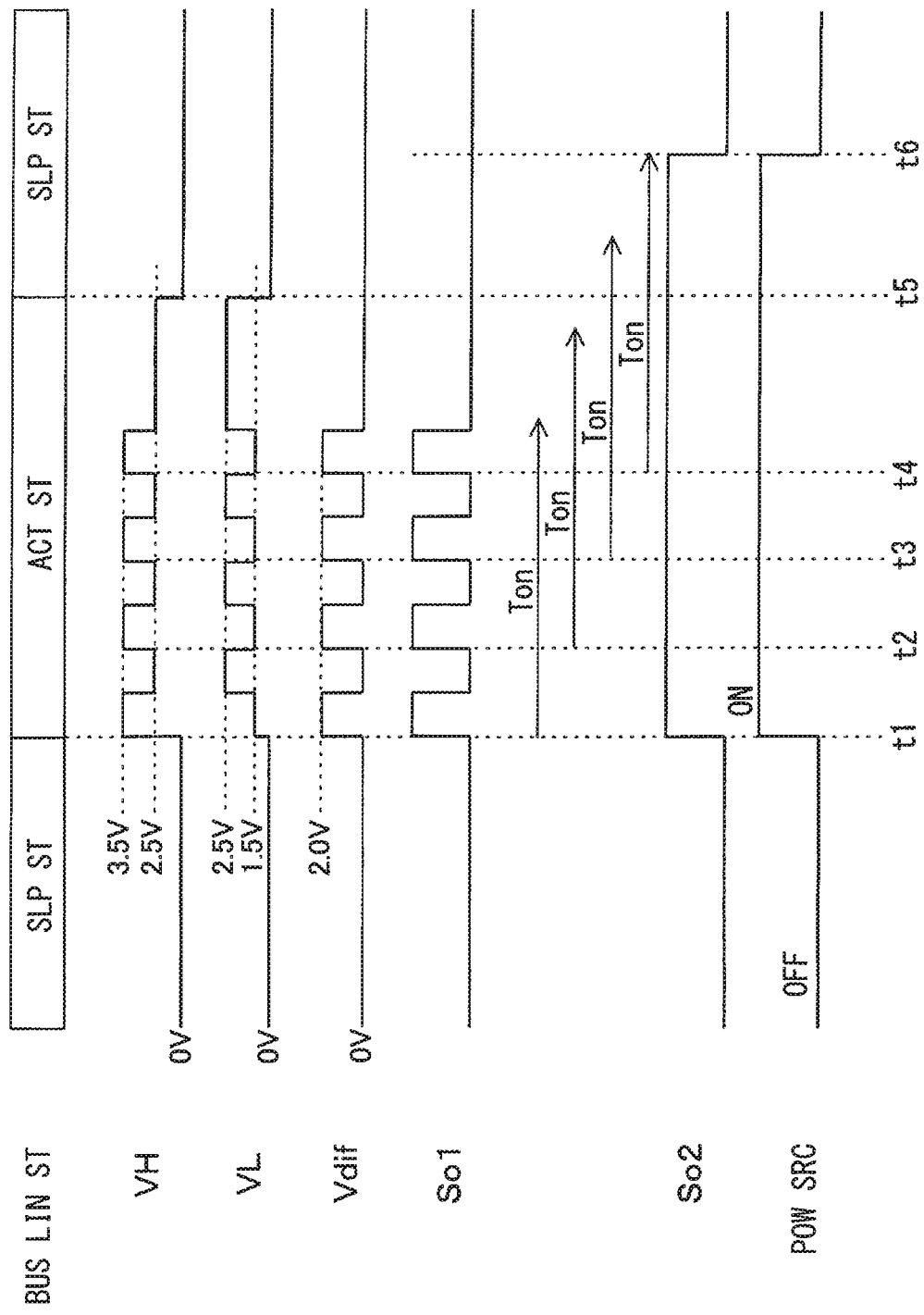
FIG. 3 is a time chart that illustrates the operation described in the first embodiment.

As shown in FIG. 3, when the bus line 11 is in a sleep state, in other words, when all of the ECUs connected to the bus line 11 stop performing communication, "VH" as a voltage in the signal line 12 and "VL" as a voltage in the signal line 13 become zero volts. Subsequently, when any of the ECUs starts transmission, the bus line is turned into an activation state; and therefore "VH" and "VL" are changed to a dominant level or a recessive level.

For instance, when it is configured that the power source voltage for driving the bus line 11 is 5 volts, "VH" is 3.5 volts and "VL" is 1.5 volts in a case where a dominant-level signal is outputted to the bus line 11. Accordingly, the differential voltage Vdif as a voltage difference (i.e., VH−VL) between the signal lines 12, 13 is 2 volts (i.e., 3.5 volts−1.5 volts). The differential voltage Vdif at 2 volts corresponds to the differential voltage Vdif at the dominant level. In other words, the differential signal is a dominant-level signal. In addition, when the recessive-level signal is outputted to the bus line 11, the intermediate voltage between "VH" and "VL" is 2.5 volts so that the differential voltage Vdif becomes 0 volts. The differential voltage Vdif at 0 volts corresponds to the differential voltage Vdif at the recessive level. In other words, the differential signal corresponds to the recessive level. It is noted that each of the above voltage values is merely an example of standard value. The value may be different from the standard value as long as the value is within the predetermined tolerance range.

On the other hands, in the communication system 10, for example, the operation power source for ECU 1 is an ignition power source; and at least two operation power source for one part of other ECUs 2 to 4 are battery power sources. The operation power source for ECU is a power source that operates the ECU. In this example, it is a power source to be supplied to the ECU for activating a microcomputer as a processing unit for the operation of ECU. In addition, the battery power source is a power source to be constantly supplied to the ECU from the battery in the automobile; and the ignition power source is a power source to be supplied to the ECU from the battery in a case where the automobile is in an ignition state.

As shown in FIG. 1, the ECU 1 includes: a microcomputer 21 for controlling the operation of the ECU 1; a communication transceiver 23 connected to the bus line 11; a waveform distortion suppression circuit 25; and a power source control circuit 27 as a power source controller for controlling power supply to the waveform distortion suppression circuit 25.

The transceiver 23 includes a receiver circuit 23a and a transmitter circuit 23b.

The receiver circuit 23a converts the differential voltage Vdif of the bus line 11 to the high-level or low-level receiving signal RxD and outputs the receiving signal RxD to the microcomputer 21. For example, the receiver circuit 23a sets the receiving signal RxD at the low level when the differential voltage Vdif is equal to or larger than the threshold value Va set to be between 0V corresponding to the recessive level and 2V corresponding to the dominant level; and sets the receiving signal to be at the high level when the differential voltage Vdif is lower than the threshold value Va. In addition, the transmitter circuit 23b outputs the dominant-level signal or the recessive-level signal to the bus line 11 in response to the high-level transmission signal TxD or the low-level transmission signal TxD outputted from the microcomputer 21.

Accordingly, the microcomputer 21 performs communication with other ECUs 2 to 4 with the use of the transceiver 23. The concept of the microcomputer 21 communicating with the other ECUs 2 to 4 corresponds to the concept of the ECU 1 communicating with other ECUs 2 to 4.

The waveform distortion suppression circuit 25 (hereinafter referred to as "suppression circuit 25") is a circuit that suppresses the distortion of the waveform of the differential signal to be transmitted in the bus line 11, and is in an operation through the supply of the power source voltage Vs. The configuration of the suppression circuit 25 is described hereinafter.

The battery power source other than the ignition power source as the operation power source is also supplied to the ECU 1. In the ECU 1, the power source circuit (not shown) generates a predetermined power source voltage Vm from the ignition power source and generates a predetermined power source voltage Vs from the battery power source. The microcomputer 21 operates through the power source voltage Vm generated from the ignition power source, and the power source voltage Vs generated from the battery power source is supplied to the suppression circuit 25 through the power source control circuit 27. In addition, the power source voltage Vs is also used as a power source for the transceiver 23 and the power source control circuit 27. The power source voltage Vm and the power source voltage Vs are, for example, 5 volts.

The power source control circuit 27 includes a switch 31, a comparator 32, and a one shot multivibrator 33.

The switch 31 supplies the power source voltage Vs to the suppression circuit 25 when the switch 31 is turned on. The switch 31 is turned on when the output signal So2 of the one shot multivibrator 33 is at an active level. In other words, the output signal So2 at the active level outputted from the one shot multivibrator 33 becomes a driving signal of the switch 31. The active level of the output signal So2 corresponds to the high level in the present embodiment; however, it may correspond to the low level. In addition, the switch 31 is configured by a switching element such as a MOSFET or a bipolar transistor; however, may be configured by a relay as another example.

The "VH" and "VL" are inputted to the comparator 32. Subsequently, the comparator 32 performs a changeover of the output signal So1 between the high level and the low level in response to whether the differential voltage Vdiff (=VH−VL) is larger than or equal to the predetermined value Vb or not. In the present embodiment, the comparator 32 sets the output signal So1 to the high level when the differential voltage Vdif is larger than or equal to the predetermined Vb; and sets the output signal So1 at the low level when the differential voltage Vdif is less than the predetermined value Vb. The predetermined value Vb is a voltage between 0 volts corresponding to the recessive level and 2 volts corresponding to the dominant level, and is set, for example, at 0.7 volts.

The one shot multivibrator 33 (hereinafter referred to as a "multivibrator 33") is a pulse generating circuit that enables re-trigger. The output signal So1 of the comparator 32 is inputted as an input signal to the multivibrator 33.

The multivibrator 33 sets the output signal So2 for turning on the switch 31 at the high-level for only a predetermined time interval Ton when an effective edge occurs in the input signal. In the present embodiment, the effective edge is a rising edge from the low level to the high level. Accordingly, the multivibrator 33 sets the output signal So2 at the high level for only the predetermined time period Ton when a rising edge (in other words, a change of rising) occurs in the output signal So1 of the comparator 32. In addition, when the multivibrator 33 sets the output signal So2 at the high level, the output of the output signal So2 at the high level is extended after the elapse of the predetermined time period Ton from the time point where an effective edge again occurs in the input signal (i.e., the output signal So1 of the comparator 32).

Figure 2:
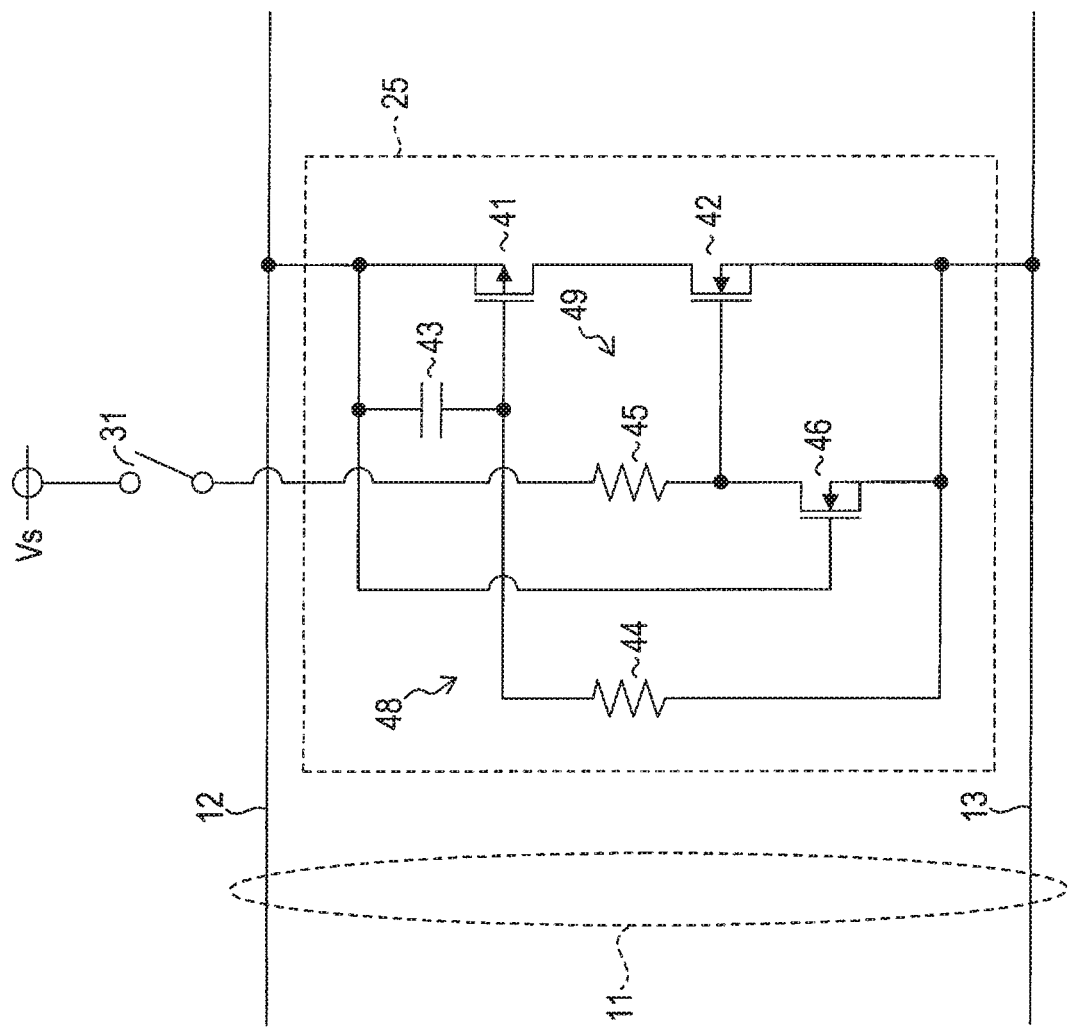
FIG. 2 is a drawing that shows the configuration of a waveform distortion suppression circuit.

As shown in FIG. 2, the suppression circuit 25 includes a P-channel MOSFET 41 and an N-channel MOSFET 42 connected in parallel, and each of the drain is connected in common between the signal lines 12, 13. The suppression circuit further includes a capacitor 43, resistors 44, 45, and an N-channel MOSFET 46.

The series circuit configured by the capacitor 43 and the resistor 44 is connected between the signal lines 12, 13. The connection point between the capacitor 43 and the resistor 44 is connected to the gate of the P-channel MOSFET 41. The series circuit configures a delay circuit 48.

The N-channel MOSFET 46 has a source terminal connected to the signal line 13, and has a gate terminal connected to the signal line 12. The drain of the N-channel MOSFET 46 is connected to one end of the resistor 45 and the gate of the N-channel MOSFET 42. The power source voltage Vs is supplied to the other end of the resistor 45 through the switch 31 in the power source control circuit 27.

The P-channel MOSFET 41 corresponds to a first switching element; and the N-channel MOSFET 42 corresponds to a second switching element. The delay circuit 48, the resistor 45 and the N-channel MOSFET 46 configures a control circuit 49.

The following describes the operation of the suppression circuit 25 when the power source voltage Vs is supplied through the switch 31.

Both ends of the signal lines 12, 13 are connected to the terminal resistor (not shown). The resistance value of the terminal resistor is, for example, 120 ohms. When the differential voltage Vdif in the bus line 11 is changed from the dominant level to the recessive level, the bus line 11 is turned to a non-driving state; and the impedance of the bus line 11 gets larger. Accordingly, the wave distortion such as overshoot or undershoot due to reflection occurs in the waveform of the differential signal transmitted through the bus line 11. In other words, ringing occurs in the waveform.

The suppression circuit 25 is a circuit that suppresses the ringing as a waveform distortion.

Since the N-channel MOSFET 46 is turned on when the differential voltage Vdif is at the dominant level, the N-channel MOSFET 42 is turned off. Since the voltage between the gate and source of the N-channel MOSFET 46 is only a voltage for charging the capacitor 43, the P-channel MOSFET 41 is turned on.

Subsequent to this situation, when the differential voltage Vdif is changed from the dominant level to the recessive level, the N-channel MOSFET 46 is turned off and then the power source voltage Vs is applied to the gate of the N-channel MOSFET 42. Accordingly, the N-channel MOSFET 42 is turned on.

Thus, the signal lines 12 and 13 are connected through the on-resistance of the P-channel MOSFET 41 and the N-channel MOSFET 42 so that the impedance gets lower. Accordingly, the energy of the waveform distortion generated in a period where the differential voltage Vdif is changed from the dominant level to the recessive level is consumed through the on-resistance so that the ringing is suppressed.

Since the charging load of the capacitor 43 is discharged through the resistor 44, the absolute value of the voltage between the gate and source of the P-channel MOSFET 41 gets lower gradually, and the P-channel MOSFET 41 is turned off when the absolute value gets lower than the threshold value.

When the control circuit 49 configured by the delay circuit 48, the resistor 45 and the N-channel MOSFET 46 detects a change in the differential voltage Vdif from the dominant level to the recessive level, the P-channel MISFET 41 and the N-channel MOSFET 42 are turned on at the same time for a predetermined time period. Thus, the control circuit 49 controls the impedance between the signal lines 12, 13 to drop significantly in a period of having a transition in the level of the differential voltage Vdiff and then the energy caused by the distortion of the waveform of the differential signal is absorbed by the on-resistance of the MOSFETs 41 and 42 so that the occurrence of the ringing is suppressed. In addition, the length of the predetermined time period can be adjusted through the capacitance of the capacitor 43 and the resistance value of the resistor 44 (i.e., the time constant of the delay circuit 48).

The other ECUs 2 to 4 has the configuration similar to the ECU 1. However, for the ECU in which the operation power source is a battery power source, the microcomputer is operated by the power source voltage Vs generated by the battery voltage.

The following describes the operation of the power control circuit 27 with reference to FIG. 3. It is noted that, in the lowermost row of FIG. 3, "OFF" indicates that the power source voltage Vs is not supplied to the suppression circuit 25; and "ON" indicates that the power source voltage Vs is supplied to the suppression circuit 25.

As indicated at the left side of the time t1 in FIG. 3, when the bus line 11 is in the sleep state, since the "VH" and "VL" are 0 volts, the output signal So1 of the comparator 32 is still at the low level so that the output signal So2 of the comparator 33 is at the low level. Accordingly, the switch 31 is turned off so as to not provide the power source voltage Vs to the suppression circuit 25.

As shown in time t1 of FIG. 3, any of the ECUs 1 to 4 connected to the bus line 11 starts transmission, and when the differential voltage Vdif changes from the recessive level (i.e., 0 volts) to the dominant level (i.e., 2 volts), the output signal So1 of the comparator 32 changes from the low level to the high level. In other words, the rising edge occurs in the output signal So1 of the comparator 32.

Subsequently, the output signal So1 of the multi vibrator 33 is changed to the high level; as a result, the switch 31 is turned on so that the power source voltage Vs is supplied to the suppression circuit 25. Then, the multivibrator 33 continues to set the output signal So2 at the high level after the elapse of the predetermined time period Ton since the rising edge occurs in the output signal So1 of the comparator 32.

In addition, when any of the ECUs 1 to 4 performs transmission, the change in the level of differential voltage Vdif such as from the dominant level to the recessive level or from the recessive level to the dominant level occurs. Accordingly, the rising edge and dropping edge occur alternately in the output signal So1 of the comparator 32.

During the multivibrator 33 sets the output signal So2 at the high level as shown in time t2 to t4 in FIG. 3, the outputting of the output signal So2 at the high level is extended after the elapse of the predetermined time period Ton from the time point where the rising edge again occurs in the output signal So1 of the comparator 32. Accordingly, when any of the ECUs 1 to 4 performs transmission, the output signal So2 of the multivibrator 33 is still at the high level so that the power source voltage Vs is continued to be supplied to the suppression circuit 25.

With regard to the predetermined time period Ton where the multivibrator 33 sets the output signal So2 at the high level, when any of the ECUs 1 to 4 performs communication, the predetermined time period Ton is set to be longer than the maximum value of the time interval where the effective edge occurs in the input signal of the multivibrator 33. The time interval where the effective edge occurs in the input signal of the multivibrator 33 is a time interval in which a change from the recessive level (in other words, the non-dominant level) to the dominant level of the differential voltage Vdif. Then, a change from the recessive level to the dominant level of the differential voltage Vdif is detected by the comparator 32 and the multivibrator 33.

Subsequently, as shown in time t5 of FIG. 3, the transmission performed by all of the ECUs 1 to 4 connected to the bus line 11 is completed and then the bus line 11 is changed from the activation state to the sleep state.

In this situation, the multivibrator 33 changes the output signal So2 from the high level to the low level at the time t6 after the elapse of the predetermined time period Ton from the time t4 at which the change in the differential voltage Vdif to the dominant level occurs. Thus, the switch 31 is turned off and then the supply of the power source voltage Vs to the suppression circuit 25 is stopped.

The ECU 1 of the present embodiment as described above further includes a power control circuit 27 for controlling the supply or cutoff of the power source voltage Vs to the suppression circuit 25 in response to a change in the differential voltage Vdif.

Accordingly, when there is a change in the differential voltage Vdif subsequent to the transmission performed by any of the ECUs including the ECU 1, the supply of the power source voltage Vs to the suppression circuit 25 is carried out. When there is no change in the differential voltage Vdif after the transmission is not carried out, the power source voltage Vs supplied to the suppression circuit 25 is cut off.

Accordingly, even if the power source voltage Vs is not constantly supplied to the suppression circuit 25, the suppression circuit 25 may still be operated if needed. As a result, the reduction in power consumption and suppression in waveform distortion can both be achieved.

For example, the suppression circuit 25 can be operated even in the situation where, with regard to a part of the other ECUs 2 to 4, the plurality of the ECUs in which the operation power source is a battery source perform communication after the ignition power source as the operation source supplied to the ECU 1 is cut off. Accordingly, the communication quality among the other ECUs can be improved. Then, the effect of improving the communication quality can be achieved even without the configuration in which the power source voltage Vs is constantly supplied to the suppression circuit 25.

The power source control circuit 27 includes: the switch 31 that performs changeover of supply and cutoff of the power source supply Vs to the suppression circuit 25; and the multivibrator 33. Then, when the multivibrator 33 detects a change in the level of the differential voltage Vdif to the dominant level, the output signal So2 at the high level for turning on the switch 31 is outputted for the predetermined time period Ton only. Moreover, when the multivibrator 33 again detects a change in the differential voltage Vdif to the dominant level during the output of the output signal So2 at the high level, the output of the output signal So2 at the high level is extended after the elapse of the predetermined time period Ton since the time point where the change is again detected.

Accordingly, even when the power source voltage Vs is not constantly supplied to the suppression circuit 25, the operation of the suppression circuit 25 in a case where any of the ECUs 1 to 4 perform communication can be achieved. It is noted that the multivibrator 33 corresponds to the signal output circuit.

In addition, the power source control circuit 27 includes a comparator 32 as a comparison circuit. The multivibrator 33 detects a change in the differential voltage Vdif through the output signal So1 of the comparator 32. Accordingly, the multivibrator 33 easily detects a change in the value of the differential voltage Vdif from a value less than the predetermined value Vb to a value larger than or equal to the predetermined Vb, in other words, a change to the dominant level.

Second Embodiment

The following describes an ECU according to a second embodiment. With regard to the components identical to the one described in the first embodiment, the same reference numerals are used in the second embodiment. The same matter is also applied to the embodiments mentioned hereinafter.

Figure 4:
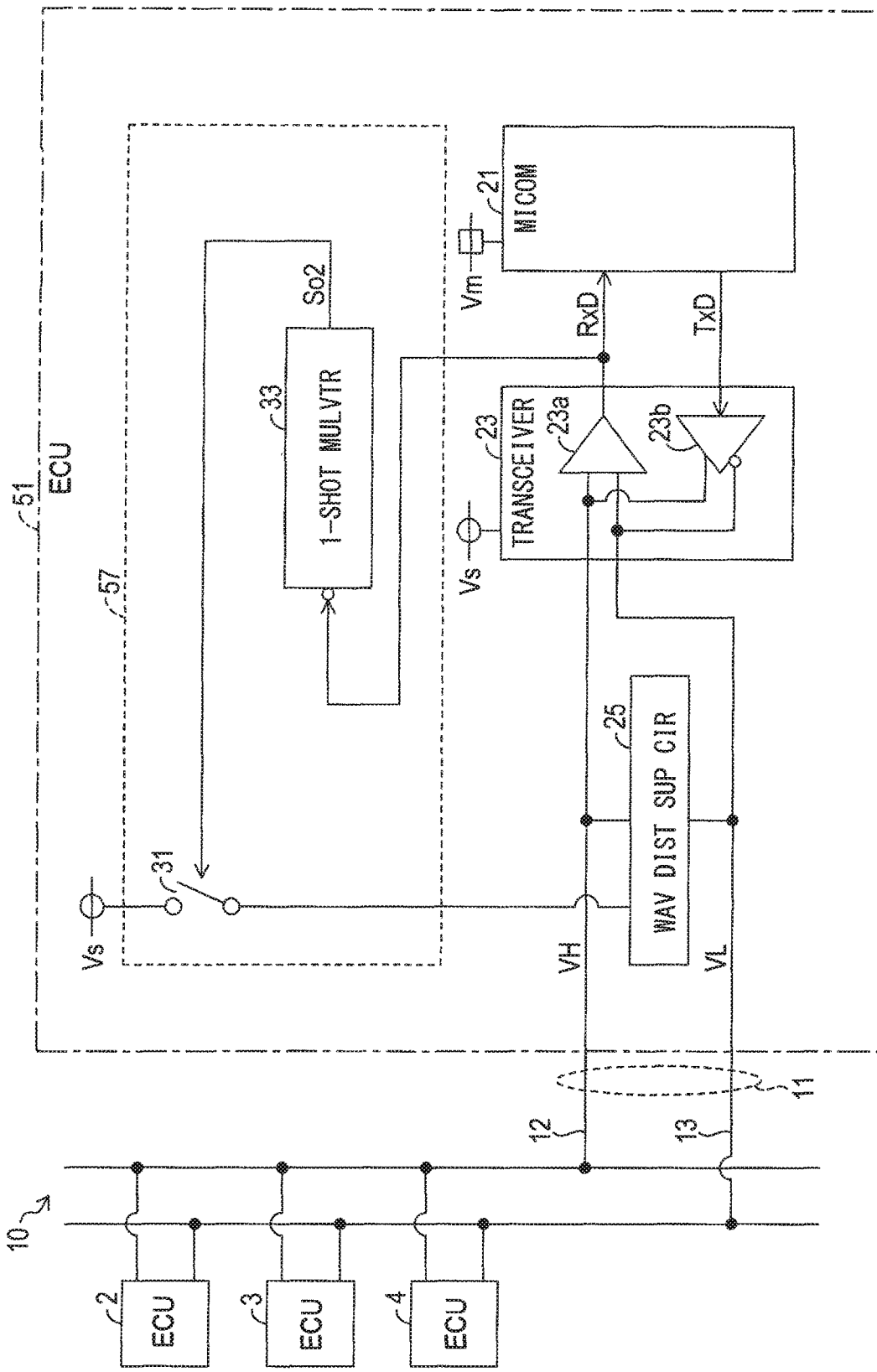
FIG. 4 is a drawing that shows the configuration of an ECU according to a second embodiment.

As shown in FIG. 4, an ECU 51 according to the second embodiment includes a power source control circuit 57 in replacement of the power source control circuit 27 used in the first embodiment.

As compare with the power source control circuit 27, the power source control circuit 57 does not include the comparator 32, and a receiving signal RxD outputted from the transceiver 23 is inputted as an input signal to the multivibrator 33. In other words, the multivibrator 33 is configured to detect a change in the differential voltage Vdif through the receiving signal RxD.

In addition, the receiving signal RxD is a signal that inverts the level of the output signal of the comparator 32 according to the first embodiment. Accordingly, with regarding to the input signal of the multivibrator 33, the effective edge is configured to be a dropping edge that is changed from the high level to the low level.

The ECU 51 described above attains the effect similar to the one generated in the ECU 1 of the first embodiment. In addition, the elimination of the comparator 32 also saves the cost and space for installation.

Third Embodiment

Figure 5:
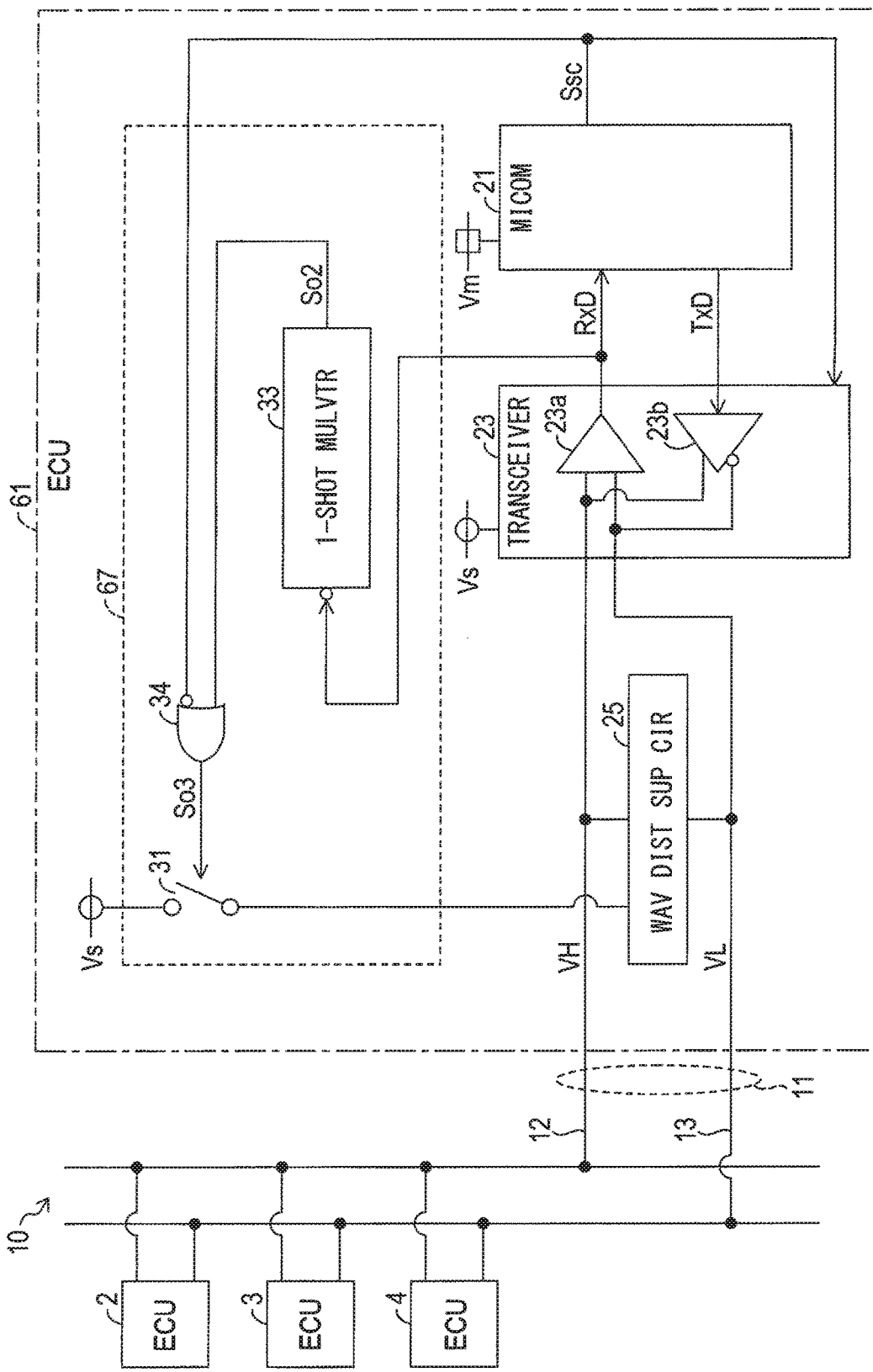
FIG. 5 is a drawing that shows the configuration of an ECU according to a third embodiment.

As shown in FIG. 5, the ECU 61 according to a third embodiment includes a power source control circuit 67 in replacement of the power source control circuit 57 used in the ECU 51 of the second embodiment.

In addition, as compare with the power source control circuit 57, the power source control circuit 67 further includes an OFF circuit 34.

The output signal So1 of the multivibrator 33 and a standby control signal Ssc outputted from the microcomputer 21 as a processing unit are inputted to the OFF circuit 34.

The standby control signal Ssc is a signal that performs a changeover of the state of the transceiver 23 between an activation state for ordinary operation and a standby state where the operation is stopped to lower the power consumption. In the present embodiment, the transceiver 23 is changed into the standby state when the standby control signal Ssc is at the high level; and is changed into the activation state when the standby control signal Ssc is at the low level. It is noted that when the transceivers 23 in all of the ECUs in the communication system are in the standby state, the bus line 11 is turned into the sleep state. In addition, when the transceiver 23 is in the activation state, the transceiver 23 carries out an operation that converts the differential voltage Vdiff in the bus line 11 to the receiving signal RxD and an operation that outputs the dominant-level signal and the recessive-level signal to the bus line 11 in response to the transmission signal TxD.

Subsequently, the OFF circuit 34 outputs an OR signal of the output signal So1 of the multivibrator 33 and the inversion signal of the standby control signal Ssc.

In addition, the switch 31 is turned on during a period in which the output signal So3 of the OFF circuit is at the high level, and then the power source voltage Vs is supplied to the suppression circuit 25.

Accordingly, the power source control circuit 67 supplies the power source voltage Vs to the suppression circuit 25 regardless of having a change in the differential voltage Vdif or not in a case where the standby control signal Ssc from the microcomputer 21 is at the high level, in other words, in a case where the microcomputer 21 sets the transceiver 23 to be in the activation state.

In the ECU 61 described above, when the microcomputer 21 enables the bus line 11 to wake up from the sleep state to the activation state, the standby control signal Ssc is set to the low level from the high level so as to activate the transceiver 23. Then, when the standby control signal Ssc is set at the low level, the supply of the power source voltage Vs to the suppression circuit 25 is started even without having a change in the differential voltage Vdif.

Accordingly, when the microcomputer 21 in the ECU 61 enables the bus line 11 to wake up, the supply of the power source voltage Vs to the suppression circuit 25 can be started prior to the timing in which the differential voltage Vdif is initially changed (in other words, the timing in which an initial signal is outputted to the bus line 11).

It is noted that the configuration with the additional OFF circuit 34 can also be applied to the ECU 1 in the first embodiment.

Fourth Embodiment

With regard to the ECUs 1, 51, 61 respectively described in the first, second, and third embodiments, the power source control circuits 27, 57, 67 may respectively be configured with the transceiver 23 in the same integrated circuit. Accordingly, the miniaturization and cost reduction for the ECUs 1, 51, 61 can be achieved.

The above describes the embodiments with regard to the present disclosure. However, the present disclosure is not limited to the above embodiments, but may also adopt a variety of modes. In addition, the above-mentioned numeral values are merely one of the examples. Other numeral values may also be used in the present disclosure.

For example, the power source control circuits 27, 57, 67 respectively in the first, second and third embodiments are configured to detect a change from the recessive level to the dominant level as a change in the differential voltage Vdif. However, a change in the target to be detected may also be a change from the dominant level to the recessive level in the differential voltage Vdif. In addition, a change in the target to be detected may also be a change from the recessive level to the dominant level or a change from the dominant level to the recessive level.

For example, the power source control circuits 27, 57, 67 may determine whether the differential voltage Vdif is at the dominant level to supply the power source voltage Vs when the differential voltage Vdif is determined to be at the dominant level or during the predetermined time period Ton from the time point where the differential voltage Vdif is determined not to be at the dominant level. Accordingly, when the differential voltage Vdif is changed to the dominant level from 0 volts after activating the bus line 11 from the sleep state, the supply of power source to the suppression circuit 25 begins. Subsequently, when a period in which the differential voltage Vdif is not at the dominant level has been elapsed longer than or equal to the predetermined time period Ton, the supply of power source to the suppression circuit 25 is stopped.

For the suppression circuit 25, a circuit having a configuration different from the configuration illustrated in FIG. 2 may also be used in, for example, the ringing suppression circuit described in Patent Literature 1. When the control circuit 49 in the suppression circuit 25 detects a change in the differential voltage Vdif from the recessive level to the dominant level, the MOSFETs 41, 42 may be configured to turn on at the same time for a predetermined time period. In addition, for example, a circuit for suppressing waveform distortion by changing the capacitance or impedance between the signal lines 12, 13 may also be used as the suppression circuit 25.

In the ECU where the operation power source is a battery power source as a part of ECUs for configuring the communication system 10, the power source voltage Vs generated from the battery voltage may be configured to be constantly supplied to the suppression circuit 25.

In addition to the ECU described above, the present disclosure may be realized by a variety of forms such as a communication system with the ECU as a configuration element, a program for controlling a computer to function as the ECU or power source control circuit, a medium for recording the program, and a power source control method in the suppression circuit.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic device having a transceiver connected to a differential signal transmission line for transmitting a differential signal through a pair of signal lines to communicate with one or a plurality of other devices connected to the differential signal transmission line, the electronic device comprising:
   a suppression circuit that is operated by a power source voltage to suppress waveform distortion in the differential signal transmitted through the differential signal transmission line; and
   a power source controller that controls supply or cutoff of the power source voltage to the suppression circuit in response to a change in a differential voltage between the pair of signal lines, wherein
   the power source controller operates based on a signal received over the differential signal transmission line.

2. The electronic device according to claim 1,
   wherein the power source controller includes:
   a switch that supplies the power source voltage to the suppression circuit when the switch is turned on; and
   a signal output circuit that carries out outputting of a driving signal for turning on the switch in a predetermined time period after detecting the change in the differential voltage, and that extends the outputting of the driving signal until an elapse of the predetermined time period from a moment when the change in the differential voltage is again detected during the outputting of the driving signal.

3. The electronic device according to claim 2,
wherein the signal output circuit detects the change in the differential voltage through a receiving signal from the transceiver.

4. The electronic device according to claim 2, wherein:
the power source controller includes a comparator circuit for receiving voltages respectively from the pair of signal lines and switching an output signal between a high level and a low level based on whether a difference between the voltages respectively from the pair of signal lines is larger than or equal to a predetermined value; and
the signal output circuit detects the change in the differential voltage through the output signal of the comparator circuit.

5. The electronic device according to claim 1, further comprising:
a processing unit that switches a state in the transceiver between an activation state for an ordinary operation and a standby state for stopping the ordinary operation to lower power consumption,
wherein the power source controller supplies the power source voltage to the suppression circuit regardless of presence or absence of the change in the differential voltage when the processing unit sets the transceiver at the activation state.

6. The electronic device according to claim 1,
wherein the power source controller and the transceiver are in a same integrated circuit.

7. The electronic device according to claim 1,
wherein the suppression circuit includes:
a first switching element and a second switching element that are connected in series between the pair of signal lines; and
a control circuit that lowers an impedance between the pair of signal lines by simultaneously turning on the first switching element and the second switching element in a predetermined time period when the change in the differential voltage is detected.

8. The electronic device according to claim 1, further comprising:
a load resistance in the suppression circuit,
wherein there is a direct connection between the power source and the load resistance.

9. The electronic device according to claim 1, wherein
the suppression circuit and the power source controller receive the same source voltage, but otherwise have no common internal devices.

* * * * *